US012555759B2

(12) United States Patent
Lin

(10) Patent No.: US 12,555,759 B2
(45) Date of Patent: Feb. 17, 2026

(54) SEMICONDUCTOR PROCESSING TOOL AND METHODS OF OPERATION

(71) Applicant: Taiwan Semiconductor Manufacturing Company, Ltd., Hsinchu (TW)

(72) Inventor: Yen-Liang Lin, Yilan County (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 18/427,078

(22) Filed: Jan. 30, 2024

(65) Prior Publication Data

US 2025/0246419 A1   Jul. 31, 2025

(51) Int. Cl.
*H01J 37/34* (2006.01)
*C23C 14/18* (2006.01)
*C23C 14/35* (2006.01)
*H01L 21/285* (2006.01)

(52) U.S. Cl.
CPC ........ *H01J 37/3455* (2013.01); *C23C 14/185* (2013.01); *C23C 14/35* (2013.01); *H01J 37/3452* (2013.01); *H01L 21/28568* (2013.01); *H01J 2237/3323* (2013.01)

(58) Field of Classification Search
CPC . H01J 37/3455; H01J 37/3452; C23C 14/185; C23C 14/35; H01L 21/28568; H01L 2237/3323
USPC ...................................................... 204/298.2
See application file for complete search history.

(56) References Cited

U.S. PATENT DOCUMENTS

| 4,877,479 A | * | 10/1989 | McNeil | ............... | H01J 37/3023 |
| | | | | | 216/60 |
| 6,440,282 B1 | * | 8/2002 | Wada | ................. | H01J 37/3408 |
| | | | | | 204/298.19 |
| 2003/0217914 A1 | * | 11/2003 | Miller | ................ | H01J 37/3408 |
| | | | | | 204/192.12 |
| 2007/0051617 A1 | * | 3/2007 | White | ................ | H01J 37/3408 |
| | | | | | 204/192.1 |
| 2013/0045348 A1 | * | 2/2013 | Chiang | ................ | C23C 14/205 |
| | | | | | 428/35.9 |
| 2016/0035547 A1 | * | 2/2016 | Johanson | ............ | H01J 37/3452 |
| | | | | | 204/192.12 |

(Continued)

FOREIGN PATENT DOCUMENTS

WO   WO-2012067183 A1 * 5/2012 ............. C23C 14/35

OTHER PUBLICATIONS

Machine Translation WO 2012067183 (Year: 2012).*

*Primary Examiner* — Rodney G Mcdonald
(74) *Attorney, Agent, or Firm* — Harrity & Harrity, LLP

(57) ABSTRACT

Some implementations herein provide a PVD tool that includes a rotational magnet system configured to generate a magnetic field in a processing chamber of the PVD tool. The magnetic field may be used to control the distribution and/or flow of material from a target structure in the processing chamber to a semiconductor substrate in the processing chamber. The rotational magnet system includes a spiral pattern of magnetic pillars on a disc structure. The quantity, spacing, and/or arrangement of the magnetic pillars in the spiral pattern are configured to reduce the likelihood of formation of hot spots in the electromagnetic field in the processing chamber.

20 Claims, 11 Drawing Sheets

(56) References Cited

U.S. PATENT DOCUMENTS

2019/0180992 A1\* 6/2019 Faune ................. H01J 37/3497
2024/0003993 A1\* 1/2024 Cheng ............... H01J 37/32926

\* cited by examiner

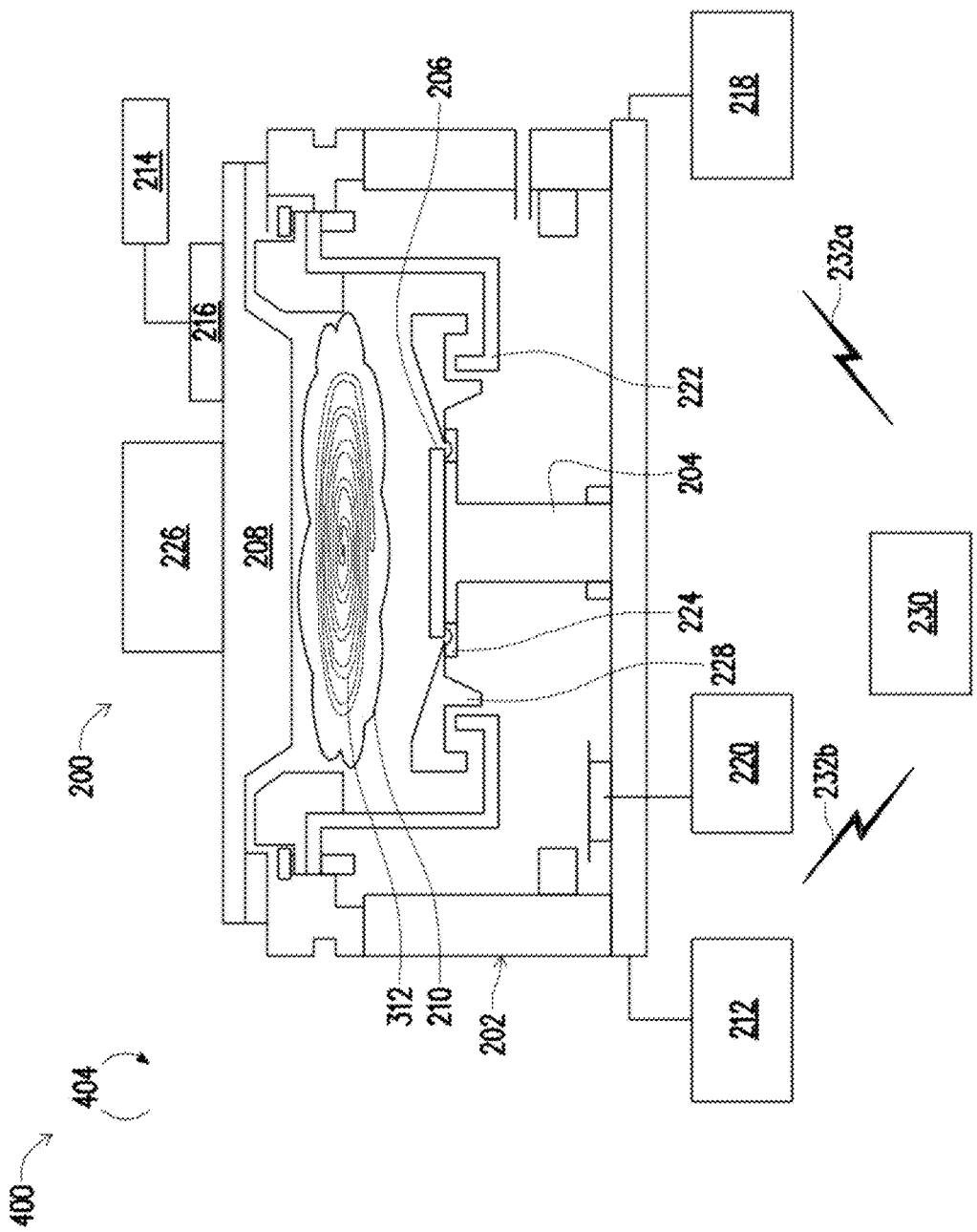

SEMICONDUCTOR PROCESSING TOOL AND METHODS OF OPERATION

BACKGROUND

A physical vapor deposition (PVD) tool, such as a sputtering tool (or sputter deposition tool) includes a semiconductor processing tool that performs a physical vapor deposition operation within a processing chamber to deposit material onto a semiconductor substrate such as a wafer. The material may include a metal, a dielectric, or another type of material. A physical vapor deposition operation (such as a sputtering operation) may include placing the semiconductor substrate on an anode in a processing chamber, in which a gas is supplied and ignited to form a plasma of ions of the gas. The ions in the plasma are accelerated toward a cathode formed of the material to be deposited, which causes the ions to bombard the cathode and release particles of the material. The anode attracts the particles, which causes the particles to travel toward and deposit onto the semiconductor substrate.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 3A-3C and 4A-4C are diagrams of example implementations described herein.

DETAILED DESCRIPTION

Figure 1:
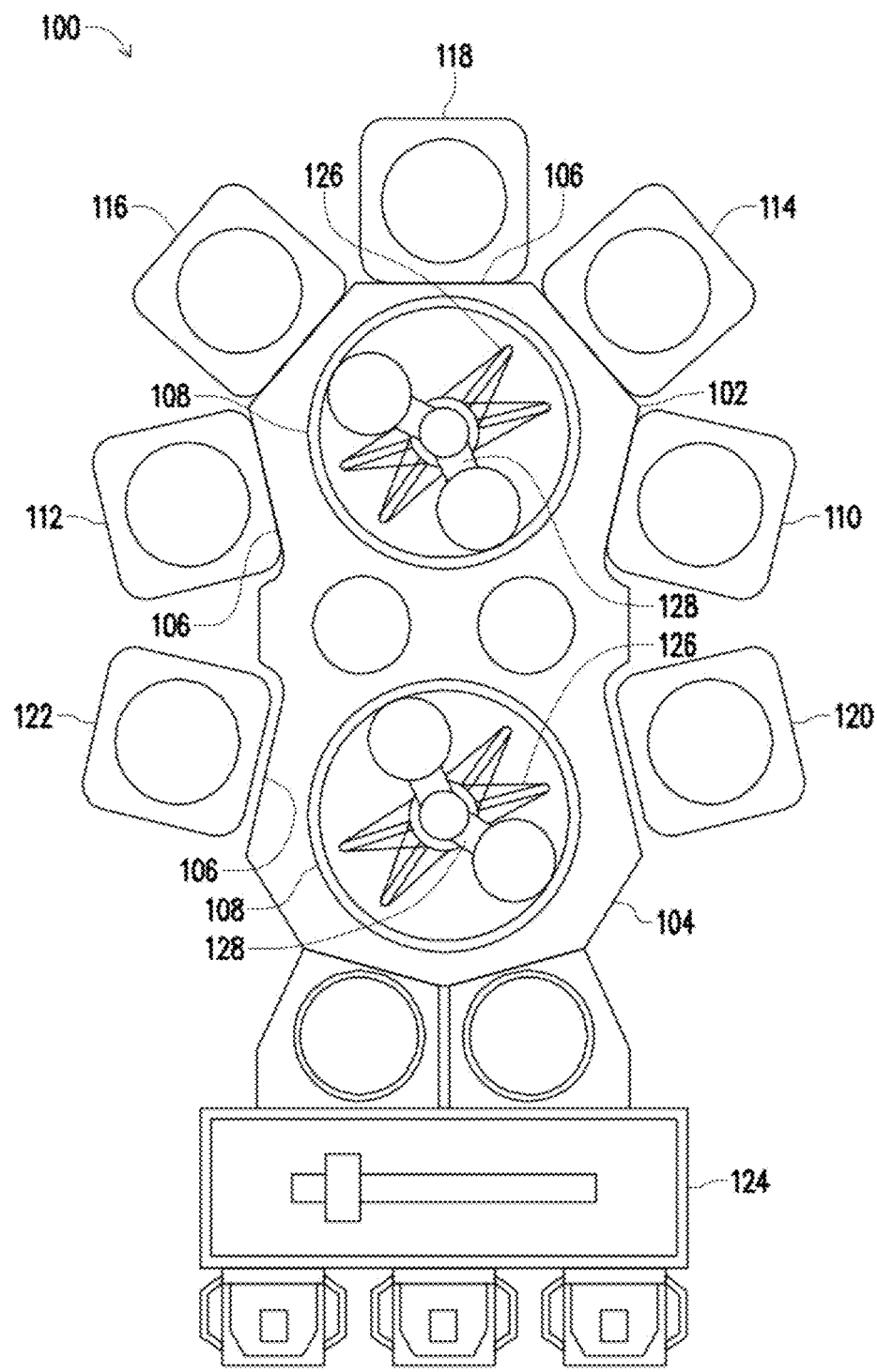
FIG. 1 is a diagram of an example semiconductor processing tool described herein.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

A processing chamber of a physical vapor deposition (PVD) tool may include a target structure and a pedestal component (e.g., a hot-plate or an electrostatic chuck, among other examples) on which a semiconductor substrate is positioned below the target structure. During a physical vapor deposition operation, such as a sputtering operation, material sourced from the target structure is deposited onto the semiconductor substrate using a plasma formed from a gas supplied between the target structure and the semiconductor substrate.

In some cases, a PVD tool may be used to deposit layers and/or structures of a semiconductor device. Depending on the thickness of a layer that is to be deposited on the semiconductor device, uniformity for the layer may be difficult to achieve in a PVD process. For example, thickness uniformity may be more difficult to control for thicker layers than for thinner layers. For thicker layers, "hot spots" in the processing chamber of the PVD tool may lead to inconsistent deposition rates across the layer as a result of non-uniformities within an electromagnetic field generated in the processing chamber. If the thickness uniformity for an electrically conductive layer (e.g., an electrode of an embedded memory device, among other examples) cannot be controlled to satisfy a uniformity threshold, the electrically conductive layer may experience increased resistivity, which can lead to reduced operating performance for the semiconductor device.

Some implementations herein provide a PVD tool that includes a rotational magnet system configured to generate a magnetic field in a processing chamber of the PVD tool. The magnetic field may be used to control the distribution and/or flow of material from a target structure in the processing chamber to a semiconductor substrate in the processing chamber. The rotational magnet system includes a spiral pattern of magnetic pillars on a disc structure. The quantity, spacing, and/or arrangement of the magnetic pillars in the spiral pattern are configured to reduce the likelihood of formation of hot spots in the electromagnetic field in the processing chamber. The reduced likelihood of hot spots in the electromagnetic field enables the PVD tool to deposit layers with high thickness uniformity, particularly for thick layers (e.g., approximately 450 angstroms or greater, among other examples). This enables the PVD tool to satisfy a uniformity threshold of a material deposited onto a semiconductor device by the PVD tool, which may decrease electrical resistance for the semiconductor device and/or may increase the operating performance of the semiconductor device. Additionally and/or alternatively, the increased deposition uniformity of the PVD tool may enable a yield of integrated circuitry fabricated as part of a semiconductor device on a semiconductor substrate is increased. Increasing the yield of the integrated circuitry may reduce a quantity of resources (e.g., raw materials, labor, semiconductor processing tools, and/or computing resources) required to fabricate a volume of the semiconductor device.

FIG. 1 is a diagram of an example semiconductor processing system 100 described herein. The semiconductor processing system 100 may perform one or more deposition processes, such as a physical vapor deposition (PVD) process, a chemical vapor deposition (CVD) process, a plasma-enhanced CVD (PECVD) process, a high-density plasma CVD (HDP-CVD) process, a sub-atmospheric CVD (SACVD) process, an atomic layer deposition (ALD) process, and/or a plasma-enhanced atomic layer deposition (PEALD) process, among other examples. As described herein, a physical vapor deposition process may correspond to a sputtering process.

In some implementations, and as shown in FIG. 1, the semiconductor processing system 100 includes one or more main frame structures 102, 104 having a plurality of sidewalls 106. The main frame structures 102, 104 and the plurality of sidewalls 106 may provide structural support to the semiconductor processing system 100.

A plurality of vacuum load lock chambers 108 is located in the center of main frame structures 102, 104. In some implementations, one or more of the vacuum load lock chambers 108 is maintained in a vacuum state to stage semiconductor substrates (e.g., silicon wafers, among other examples) for processing within the semiconductor processing system 100 to receive the semiconductor substrates after processing within the semiconductor processing system 100. Each of the plurality of vacuum load lock chambers 108 spatially separates the semiconductor substrates from processing chambers of the semiconductor processing system 100.

The semiconductor processing system 100 includes a plurality of processing chambers 110, 112, 114, 116, 118, 120, and 122. Each processing chamber may include one or more components to deposit material using a deposition process onto a semiconductor substrate received from one of the plurality of vacuum load lock chambers 108.

An external semiconductor substrate elevator 124 is located adjacent to the semiconductor processing system 100. In some implementations, the external semiconductor substrate elevator 124 is a part of the semiconductor processing system 100. In some implementations, the external semiconductor substrate elevator 124 is a component that is separate from the semiconductor processing system 100. The external semiconductor substrate elevator 124 is configured to hold a cassette containing a plurality of semiconductor substrates. The external semiconductor substrate elevator 124 also includes an automatic distributor for selecting a semiconductor substrate from the plurality of semiconductor substrates and timely supplying the selected semiconductor substrate to one of the plurality of vacuum load lock chambers 108 to stage for processing by one of the processing chambers 110-122.

The semiconductor processing system 100 may further include, within one or more of the plurality of vacuum load lock chambers 108, a semiconductor substrate transfer system 126 including a plurality of robotic arms 128. The semiconductor substrate transfer system 126, including the plurality of robotic arms 128, may operate in conjunction with the external semiconductor substrate elevator 124 to transport semiconductor substrates amongst a cassette on the external semiconductor substrate elevator 124, and to and/or from one or more of the processing chambers 110-122.

One or more of the processing chambers 110-122 may be subjected to a deposition operation to clean the one or more of the processing chambers 110-122 and to maintain a degree of cleanliness in the one or more of the processing chambers 110-122. Examples of such a deposition operation include a burn-in deposition operation that forms a plasma to remove particulates from a target structure material within the one or more of the processing chambers 110-122, a pasting deposition operation that coats an interior surface within the one or more of the processing chambers 110-122 to prevent flaking of particulates from the interior surface, and/or another deposition operation.

As indicated above, FIG. 1 is provided as an example. Other examples may differ from what is described with regard to FIG. 1. For example, another example may include additional components, fewer components, different components, or differently arranged components than those shown in FIG. 1. Additionally, or alternatively, a set of components (e.g., one or more components) of FIG. 1 may perform one or more functions described herein as being performed by another set of components.

Figure 2:
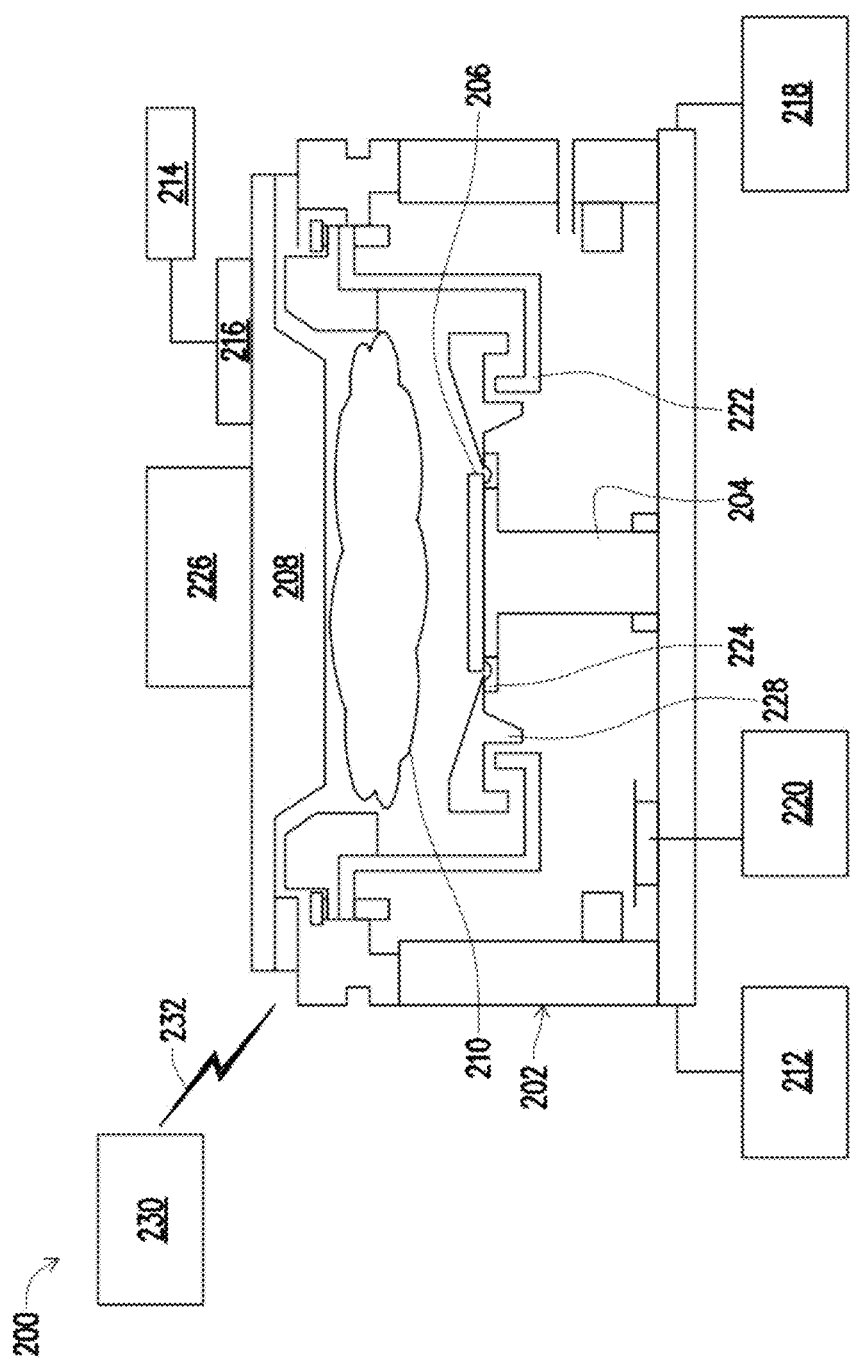
FIG. 2 is a diagram of an example deposition tool described herein for use in the semiconductor processing tool of FIG. 1.

FIG. 2 is an example deposition tool 200 described herein. In some implementations, the deposition tool 200 is for use in the semiconductor processing system 100 of FIG. 1. The deposition tool 200 includes a processing chamber 202 which may correspond to one of the processing chambers 110-122 as described in connection with FIG. 1. The deposition tool 200 further includes a pedestal component 204 including a chuck (e.g., an electrostatic chuck (ESC) or a vacuum chuck, among other examples) upon which a semiconductor substrate 206 (e.g., a semiconductor wafer) is positioned and secured. In some implementations, the pedestal component 204 includes a heating component (e.g., a hot plate, among other examples) to provide heat to the semiconductor substrate 206 during the deposition process and/or the sputtering operation. The pedestal component 204 may be, for example, fabricated from aluminum, stainless steel, ceramic, or combinations thereof.

In some implementations, the deposition tool 200 includes a target structure 208. The target structure 208 may include a material to be deposited on to the semiconductor substrate 206. The target structure 208 may include a tantalum nitride material, a lead zirconate titanate material, a silicon nitride material, a silicon dioxide material, a tantalum pentoxide material, a tungsten material, or a cobalt iron boron material, among other examples.

Within the processing chamber 202, a plasma 210 may be formed from a gas (krypton, argon, or another chemically inert gas, among other examples) and supplied between the target structure 208 and the semiconductor substrate 206. One or more electrical bias voltages may be applied to the target structure 208 and or the pedestal component 204. An electrical bias may be applied to the target structure 208 to cause ions in the plasma 210 to accelerate towards the target structure 208 to sputter etch the target structure 208. This causes material of the target structure 208 to be dislodged and mobilized. In some implementations, an electromagnetic field is applied to the pedestal component 204 to generate an electrical potential or electric field between the target structure 208 and the semiconductor substrate 206. This promotes or facilitates a flow of particulates of the inert metal material that are dislodged from the target structure 208 toward the semiconductor substrate 206. In some implementations, applying the electrical bias to the pedestal component 204 may modulate an electromagnetic field (e.g., alter or change a magnetic flux or strength of the electromagnetic field, among other examples) between the semiconductor substrate 206 and the target structure 208.

An example of a biasing power source that may be included in the deposition tool 200 includes a radio frequency (RF) power circuit 212. The radio frequency power circuit 212 generates a radio frequency bias voltage within the processing chamber 202. The radio frequency bias voltage may promote or facilitate a flow of the inert metal material that was dislodged from the target structure 208 toward the semiconductor substrate 206. Another radio frequency bias voltage may be used in connection with generating the plasma 210 and/or accelerating ions in the plasma 210 toward the target structure 208.

Another example of a biasing power source that may be included in the deposition tool 200 includes a direct current (DC) power circuit 214. The direct current power circuit 214 generates direct current power in the form of a direct current bias voltage. In some implementations, the direct current power circuit 214 is connected to the target structure 208 using an electrode 216 and is configured to supply the target structure 208 with the direct current bias voltage. In some implementations, the direct current bias voltage provided to the target structure 208 by the direct current power circuit 214 is included in a range of approximately 250 volts to approximately 300 volts. However, other values and ranges for the direct current bias voltage provided by the direct current power circuit 214 are within the scope of the present disclosure.

In some implementations, the deposition tool 200 includes a gas supply system 218 that supplies one or more gases used to form plasmas (e.g., the plasma 210 used for the deposition process or another plasma used for the deposition operation, among other examples). The gas supply system 218 may control a rate of flow of the gas (argon or krypton, among other examples), which controls one or more parameters of the plasma 210 including the ionization rate in the plasma 210, the ion passivation rate on the semiconductor substrate 206, and/or another parameter.

The deposition tool 200 further includes a vacuum pump 220. The vacuum pump 220 is connected to the deposition tool 200. The vacuum pump 220 is configured to create a vacuum state in the processing chamber 202 during the deposition process and/or the deposition operation.

The deposition tool 200 further includes a lower shield 222 and a platen ring 224. The lower shield 222 may shield the semiconductor substrate 206 during the deposition process. The platen ring 224 may assist maintaining a position of the semiconductor substrate 206 during the deposition process. The platen ring 224 may be fabricated from a material that can resist erosion by the generated plasma 210, for example, a metallic material such as stainless steel, titanium, or aluminum, or a ceramic material such as aluminum oxide. However, another suitable material may be used such as a synthetic rubber, a thermoset, a plastic, a thermoplastic, or any other material that meets a chemical compatibility, durability, sealing, and/or temperature requirement of the deposition process and/or the deposition operation.

The deposition tool 200 further includes a rotational magnet system 226. In some implementations, the rotational magnet system 226 enhances consumption of the inert metal material from the target structure 208 during the deposition process. As described in greater detail in connection with FIGS. 3A-3C, and elsewhere herein, the rotational magnet system 226 may include a pattern of magnetic components that are rotated above the semiconductor substrate 206 during a deposition operation. Further, and in some implementations, the rotational magnet system 226 may be an unbiased rotational magnet system (e.g., no power is applied to the rotational magnet system 226 to bias an electromagnetic field generated by the rotational magnet system 226).

In some implementations, the deposition tool 200 includes an upper shield 228. The upper shield 228 is positioned adjacent to the pedestal component 204. The upper shield 228 may be supported by the lower shield 222. The lower shield 222 and the upper shield 228 cooperate to reduce or eliminate materials from the target structure 208 from coming in contact with components (e.g., the pedestal component 204) of the deposition tool 200. The lower shield 222 and the upper shield 228 may be fabricated from a material that can resist erosion by the generated plasma 210, such as a stainless-steel material, a titanium material, an aluminum material, or a ceramic material, among other examples.

The deposition tool 200 further includes a controller 230. The controller 230 (e.g., a processor, a combination of a processor and memory, among other examples) may communicatively couple to one or more components of the deposition tool 200 (e.g., the radio frequency power circuit 212, the direct current power circuit 214, the gas supply system 218, and/or the direct current power circuit 214, among other examples) using one or more communication links 232. The one or more communication links 232 may include or more wireless-communication links, one or more wired-communication links, or a combination of one or more wireless-communication links and one or more wired-communication links, among other examples. In some implementations, the controller 230 is external to the deposition tool 200.

The number and arrangement of devices shown in FIG. 2 are provided as one or more examples. In practice, there may be additional devices, fewer devices, different devices, or differently arranged devices than those shown in FIG. 2. Furthermore, two or more devices shown in FIG. 2 may be implemented within a single device, or a single device shown in FIG. 2 may be implemented as multiple, distributed devices.

Figure 3A:
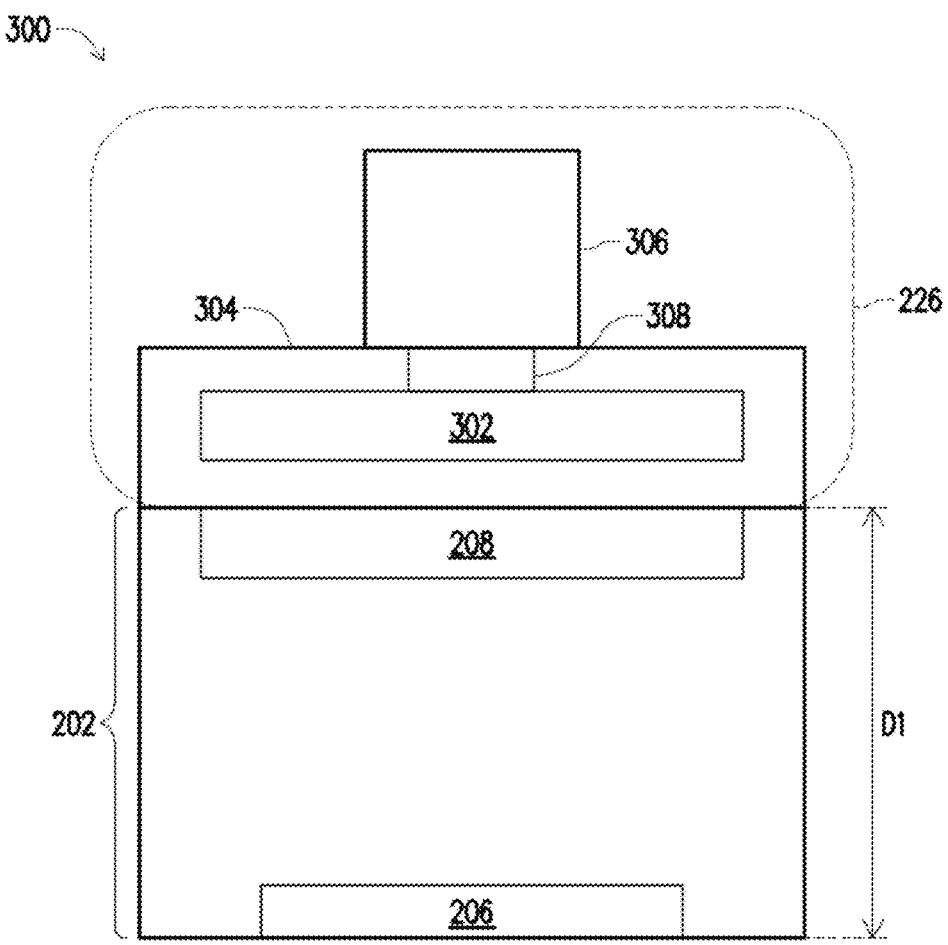
Figure 3B:
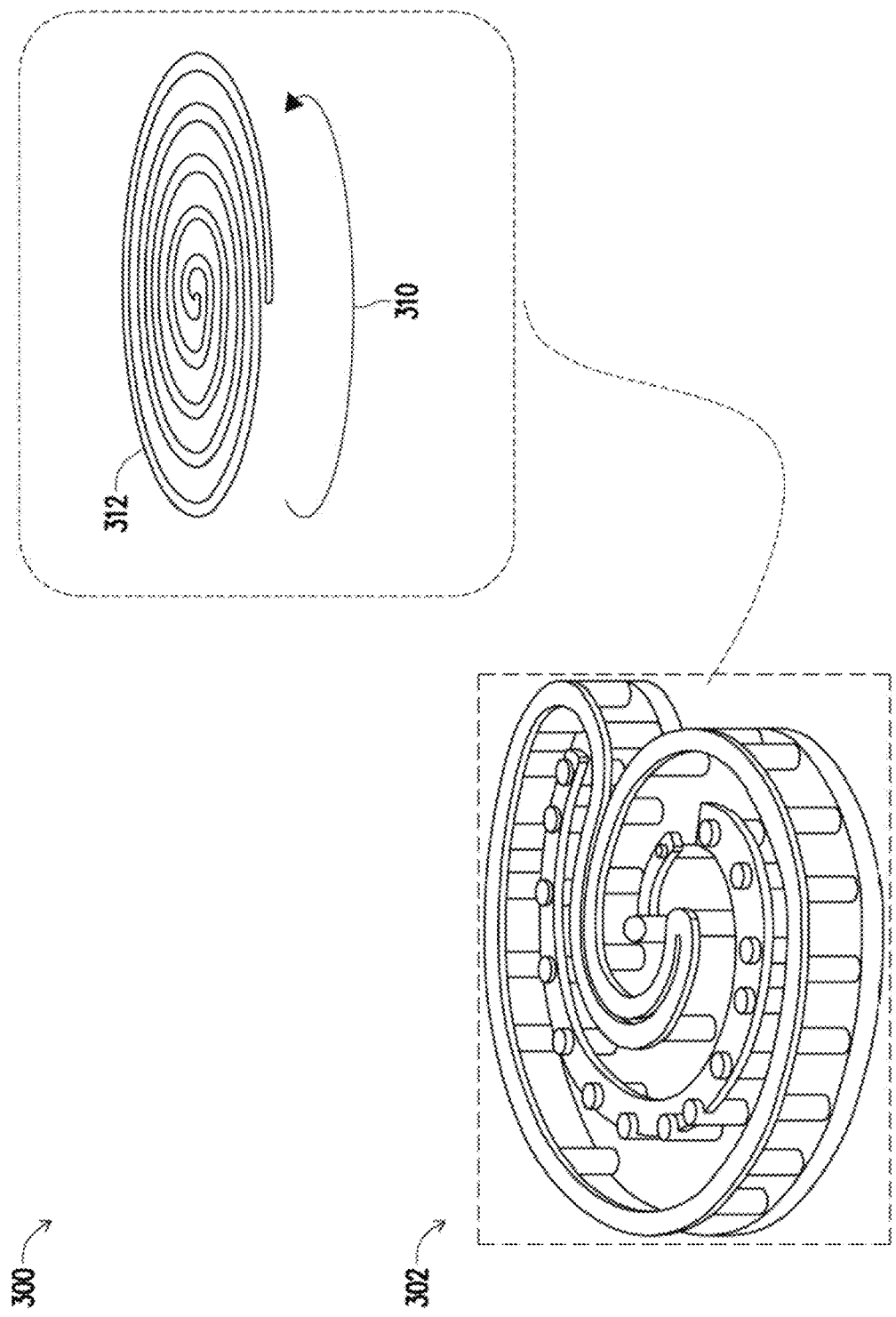
Figure 3C:
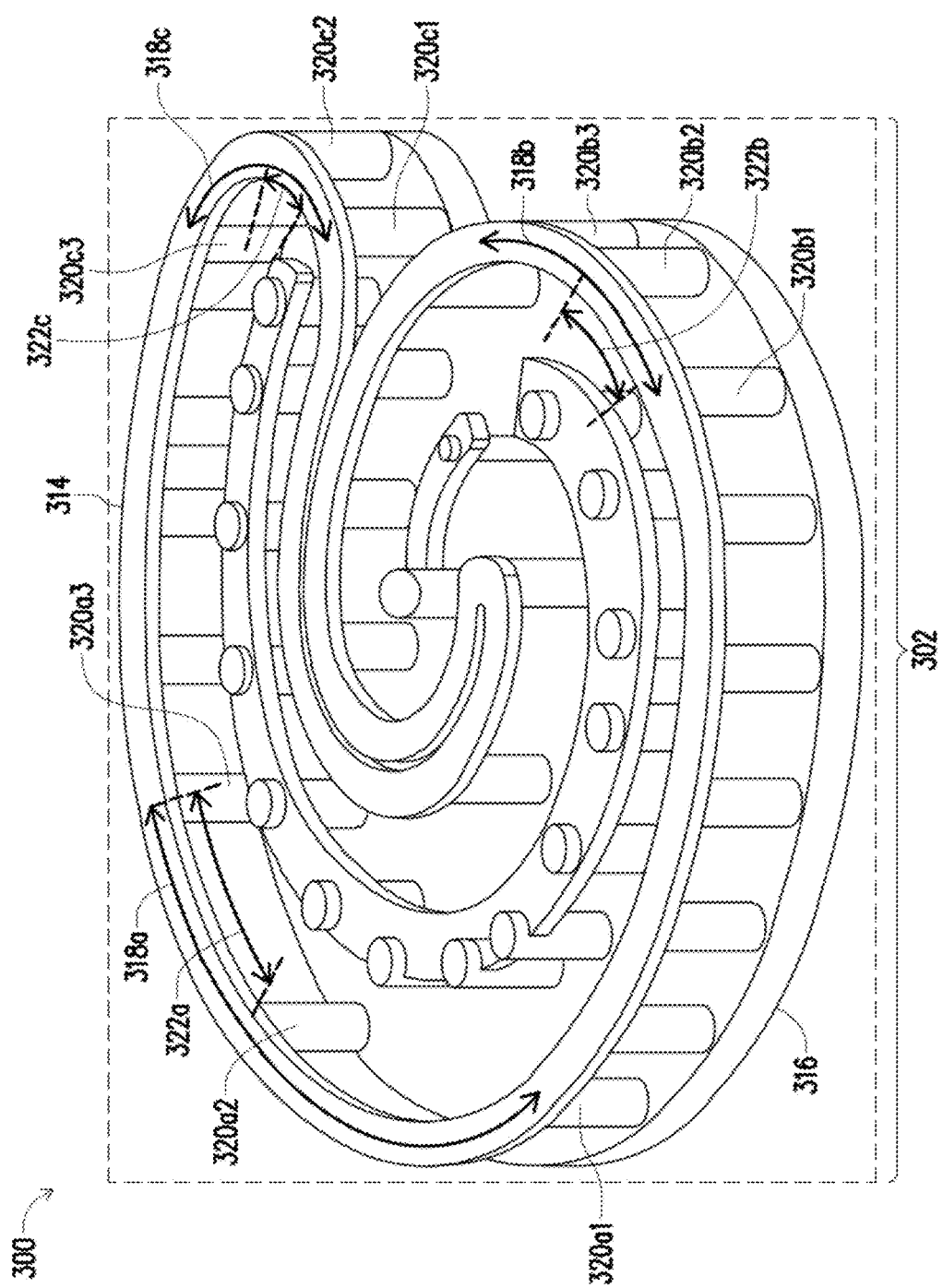

FIGS. 3A-3C are diagrams of an example implementation 300 described herein. The implementation 300 includes one or more aspects of a deposition tool (e.g., the deposition tool 200 of FIG. 1), including the rotational magnet system 226.

As shown in FIG. 3A, the rotational magnet system 226 is over the processing chamber 202. In some implementations, a configuration of the processing chamber 202 includes a chamber spacing D1 (e.g., a distance from a base of the target structure 208 to a base of the semiconductor substrate 206) that is included in a range of approximately 54 millimeters to approximately 66 millimeters. To achieve such a configuration, the deposition tool may exclude one or more adapters that may be found in other deposition tools between the rotational magnet system 226 and the processing chamber 202.

If the distance D1 is less than approximately 54 millimeters, a material deposited from the target structure 208 onto the semiconductor substrate 206 may not satisfy a thickness variation threshold. If the distance D1 is greater than approximately 54 millimeters, and less than approximately 66 millimeters, the material deposited from the target structure 208 onto the semiconductor substrate 206 may satisfy the thickness variation threshold. If the distance D1 is greater than approximately 66 millimeters, an amount of foreign contaminants (e.g., particulates other than the particulates dislodged from the target structure 208) in the processing chamber 202 may increase to contaminate the semiconductor substrate 206 during a deposition operation. However, other values and ranges for the distance D1 are within the scope of the present disclosure.

As described in greater detail in connection with FIGS. 3B and 3C, the rotational magnet system 226 includes a magnet fixture 302 that includes a distribution and/or a pattern of magnetic components. The rotational magnet system 226 includes a housing 304 that encloses the magnet fixture 302, a motor 306 (e.g., a stepper motor or a servo motor) to rotate the magnet fixture 302, and a feed-through linkage 308 (e.g., a shaft) that connects the magnet fixture 302 and the motor 306.

FIG. 3B shows an isometric view of the magnet fixture 302. As shown in FIG. 3B, a rotational vector 310 may be applied to the magnet fixture 302 (e.g., the motor 306 may rotate the magnet fixture 302 within an approximately planar and circular area). Furthermore, the magnet fixture 302 may generate an electromagnetic field 312 (e.g., a rotating electromagnetic field).

FIG. 3C shows additional details of the magnet fixture 302. The magnet fixture 302 includes a frame structure 314 and a disc structure 316. The frame structure 314 and/or the disc structure 316 may include a rigid material that is non-magnetic and resistant to corrosion (e.g., stainless steel or another suitable material). In some implementations, the frame structure 314 includes multiple segments that combine to form an approximately spiral shape.

The magnet fixture 302 includes a distribution of magnetic components 320, where each of the magnetic components 320 corresponds to a vertically-arranged magnetic pillar that is between the disc structure 316 and the frame structure 314. In some implementations, and as shown in FIG. 3C, the magnetic components 320 are arranged in a spiral pattern and include a quantity of 43 magnetic components. However, other shapes, orientations, quantities, and/or arrangements of the magnetic components 320 are within the scope of the present disclosure.

As shown in FIG. 3C, the magnet fixture 302 includes a curved segment 318a (e.g., a first, outermost curved segment) that is located on and/or above a first perimeter region of the disc structure 316. The curved segment 318a includes a first set of magnetic components 320a1-320a3 with an average radial spacing 322a (e.g., a first average radial spacing or a first average curved spacing). As further shown in FIG. 3C, the magnet fixture 302 includes a curved segment 318b (e.g., a second, outermost curved segment) that is located on and/or above a second perimeter region of the disc structure 316, where the second perimeter region is opposite the first perimeter region. The curved segment 318b includes a second set of magnetic components 320b1-320b3 with an average radial spacing 322b (e.g., a second average radial spacing or a second average curved spacing). As further shown in FIG. 3C, the magnet fixture 302 includes a curved segment 318c (e.g., a third, outermost curved segment) that is located on and/or above a third perimeter region of the disc structure 316, where the third perimeter region is opposite the first perimeter region and adjacent to the second perimeter region. The curved segment 318c includes a third set of magnetic components 320c1-320c3 with an average radial spacing 322c (e.g., a third average radial spacing or a third average curved spacing).

In some implementations, one or more of the average radial spacings 322a-322c may be different. For example, and in some implementations and as show in FIG. 3C, the average radial spacing 322b is less than the average radial spacing 322a. Additionally, or alternatively, the average radial spacing 322c is less than the average radial spacing 322a. As described in greater detail in connection with FIGS. 4A-4C, 5, and 6, the differences in the average radial spacings 322a-322c may improve a distribution and/or a uniformity of an electromagnetic field generated by the magnet fixture 302 to improve a uniformity of a thickness of a material deposited by a deposition tool using the magnet fixture 302 (e.g., the deposition tool 200 using the rotational magnet system 226 including the magnet fixture 302).

As indicated above, FIGS. 3A-3C are provided as an example. Other examples may differ from what is described with regard to FIGS. 3A-3C.

In some implementations, and as described in connection with FIGS. 2, 3A-3C, and elsewhere herein, a deposition tool (e.g., the deposition tool 200) includes a rotational magnet system (e.g., the rotational magnet system 226) that includes a distribution of magnetic components (e.g., the magnetic components 320) configured to generate an electromagnetic field (e.g., the electromagnetic field 312). The distribution of magnetic components includes a first curved segment (e.g., the curved segment 318a) that is located on a first perimeter region of a disc structure (e.g., the disc structure 316) and having a first set of magnetic components (e.g., the magnetic components 320a1-320a3) with a first average radial spacing (e.g., the average radial spacing 322a). The distribution of magnetic components includes a second curved segment (e.g., the curved segment 318b) that is located on a second perimeter region of the disc structure and having a second set of magnetic components (e.g., the magnetic components 320b1-320b3) with a second average radial spacing (e.g., the average radial spacing 322b), where the second average radial spacing is less than the first average radial spacing. The deposition tool includes a processing chamber (e.g., the processing chamber 202) below the rotational magnet system. The deposition tool includes a controller (e.g., the controller 230) configured to activate the rotational magnet system to rotate the distribution of magnetic components above the processing chamber during a sputtering operation.

Figure 4A:
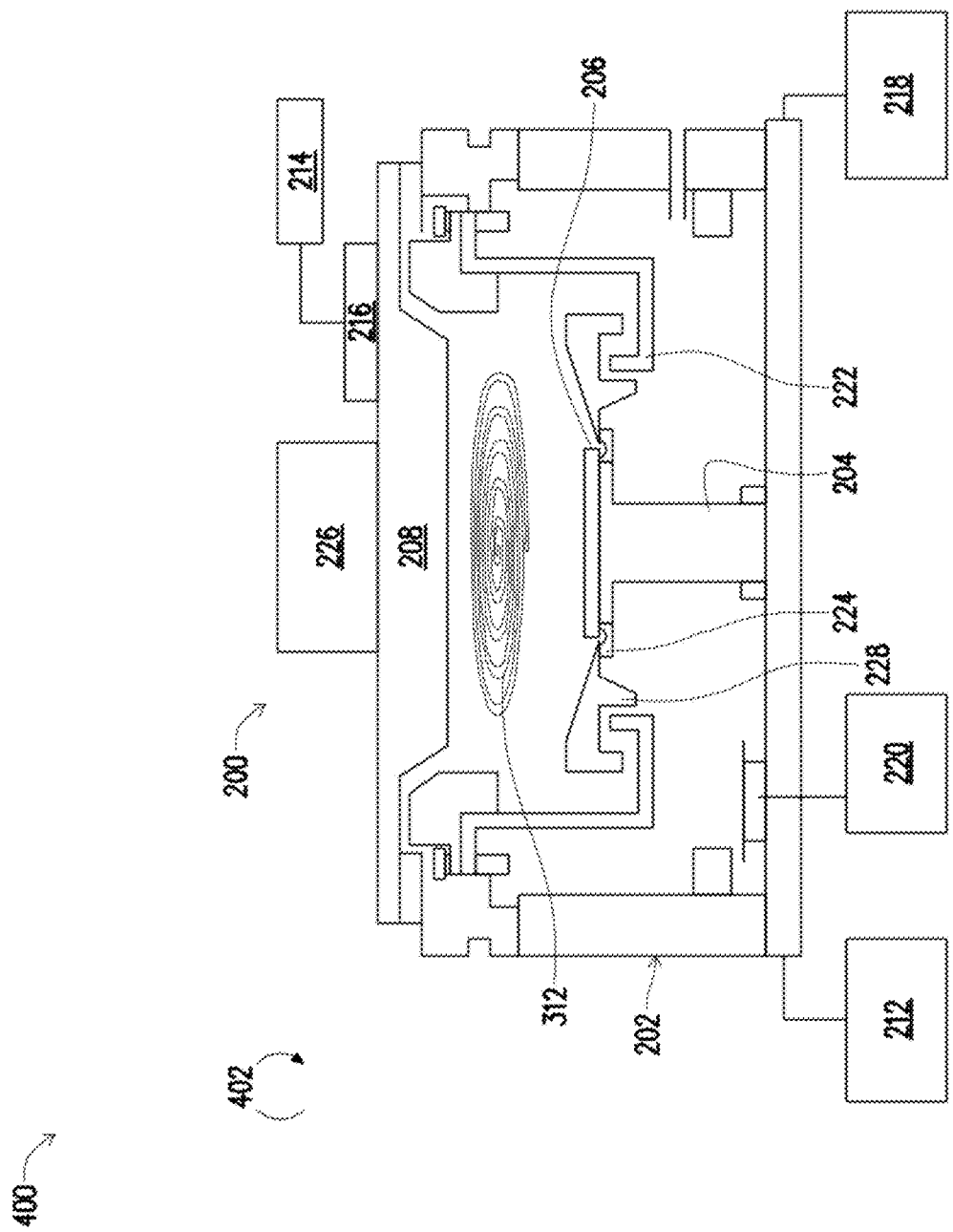
Figure 4C:
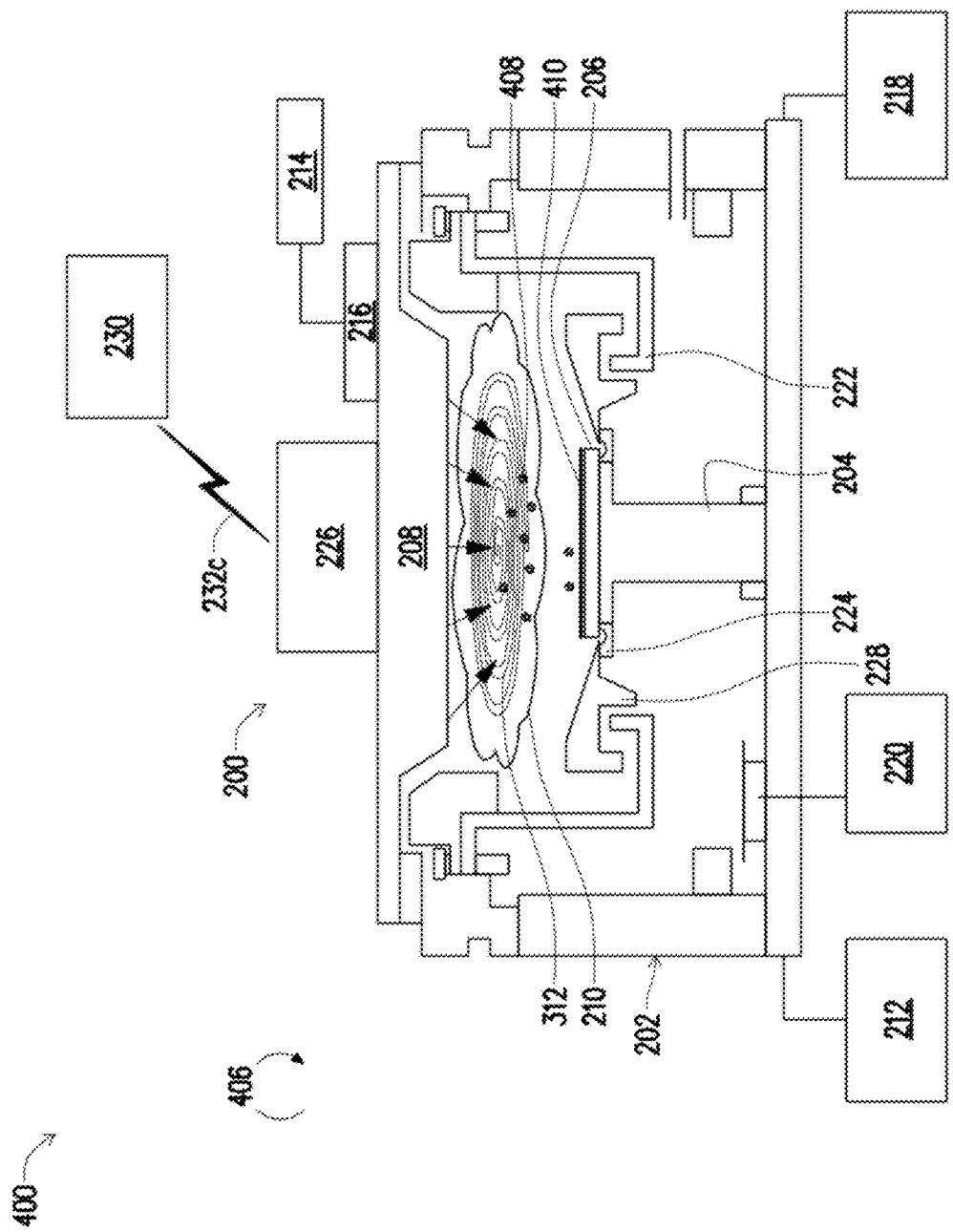

FIGS. 4A-4C are diagrams of an example implementation 400 described herein. In particular, the implementation 400 includes an example process for performing a deposition operation using the deposition tool 200 described in connection with FIGS. 2, 3A-3C, and elsewhere herein. In some implementations, the deposition operation described in connection with FIGS. 4A-4C corresponds to a sputtering deposition operation.

As shown in FIG. 4A, an operation 402 includes the deposition tool 200 receiving the semiconductor substrate 206 onto the pedestal component 204 in the processing chamber 202. In some implementations, a temperature of an environment within the processing chamber 202 (during the deposition operation of implementation 400) is a same approximate temperature as a temperature of an ambient environment in which the processing chamber 202 is located (e.g., a room temperature surrounding the deposition tool 200). The deposition tool 200 may receive the semiconductor substrate 206 using the semiconductor substrate transfer system 126 as described in connection with FIG. 1.

The semiconductor substrate 206 is received below the target structure 208 and below the electromagnetic field 312 generated by the rotational magnet system 226. In some implementations, an electrical power that alters, changes, or affects a strength and or distribution of the electromagnetic field 312 is not applied or modulated through components and/or systems included in the deposition tool 200 (the pedestal component 204 or the rotational magnet system 226, among other examples). In other words, the electromagnetic field 312 may be an unbiased electromagnetic field.

As shown in FIG. 4B, an operation 404 includes the controller 230 transmitting a signal using the communication link 232a to the gas supply system 218 to initiate a flow of a gas into the processing chamber 202. The operation 404 may further include the controller 230 transmitting a signal using the communication link 232b to activate the radio frequency power circuit 212. Initiating the flow of the gas and activating the radio frequency power circuit 212 may generate the plasma 210 within the processing chamber 202.

As shown in FIG. 4C, and as part of an operation 406, a physical vapor deposition operation occurs within the processing chamber 202. Particulates 408 from the target structure 208 are dislodged and accelerated towards the semiconductor substrate 206 to form a layer of material 410 (e.g., a layer of a tungsten material) on a surface of the semiconductor substrate 206. The operation 406 may include the controller 230 transmitting a signal using the communication link 232c to the rotational magnet system 226 (e.g., the motor 306 of the rotational magnet system 226) to control a rotational vector (e.g., the rotational vector 310) of a fixture generating the electromagnetic field 312 (e.g., a rate of rotation of the magnet fixture 302).

For example, and in some implementations, generating the electromagnetic field 312 may include the controller 230 transmitting a signal that causes the motor 306 to vary (e.g., accelerate and/or decelerate) a rate of rotation of the fixture 302 during the physical vapor deposition operation. Additionally, or alternatively and in some implementations, generating the electromagnetic field 312 may include the controller 230 transmitting a signal that causes the motor 306 to temporarily stall a rotation of the fixture 302. Additionally, or alternatively and in some implementations, generating the electromagnetic field 312 may include the controller 230 transmitting a signal that causes the motor 306 to change a rotational direction of the fixture 302.

In some implementations, the controller 230 determines a rotational profile using a machine learning model. The machine learning model may include and/or may be associated with one or more of a neural network model, a random forest model, a clustering model, or a regression model. In some implementations, the controller 230 uses the machine learning model to determine the rotational profile by providing candidate parameters (e.g., a pattern of the magnetic components 320, a rate of rotation, a direction of rotation, and/or pauses in rotation) as inputs to the machine learning model, and using the machine learning model to determine a likelihood, probability, or confidence that a particular outcome (e.g., a thickness and/or profile of the layer of material 410) for a physical deposition operation will be achieved using the candidate parameters.

The controller 230 (or another system) may train, update, and/or refine the machine learning model to increase the accuracy of the outcomes and/or parameters determined using the machine learning model. The controller 230 may train, update, and/or refine the machine learning model based on feedback and/or results from the subsequent deposition operation, as well as from historical or related deposition operations (e.g., from hundreds, thousands, or more historical or related deposition operations) performed by the deposition tool 200.

The rotational magnet system 226 (e.g., including the reduced quantity of magnetic components 320 and/or the difference in the average radial spacings 322a and 322b) may reduce and/or alleviate hot spots of the electromagnetic field 312 generated relative to another electromagnetic field generated by another rotational magnet system. Reducing and/or alleviating the hot spots may improve an ability of the deposition tool 200 to satisfy a uniformity threshold of the layer of material 410 deposited by the deposition tool 200. In this way, a yield of integrated circuitry fabricated as part of a semiconductor device on a semiconductor substrate 206 is increased. Increasing the yield of the integrated circuitry may reduce a quantity of resources (e.g., raw materials, labor, semiconductor processing tools, and/or computing resources) required to fabricate a volume of the semiconductor device.

As indicated above, FIGS. 4A-4C are provided as examples. Other examples may differ from what is described with regard to FIGS. 4A-4C. For example, another example may include additional operations, fewer operations, different operations, or differently arranged operations than those shown in FIGS. 4A-4C.

As described in connection with FIGS. 2, 3A-3C, and 4A-4C, a deposition tool (e.g., the deposition tool 200) performs a series of operations. The series of operations includes receiving, onto a pedestal component (e.g., the pedestal component 204), a semiconductor substrate (e.g., the semiconductor substrate 206). The series of operations includes generating, over the semiconductor substrate, an electromagnetic field (e.g., the electromagnetic field 312) using a rotational magnet system (e.g., the rotational magnet system 226), where the rotational magnet system includes a first curved segment (e.g., the curved segment 318a) of vertically-arranged magnetic pillars (e.g., the magnetic components 320a1-320a3) having a first average radial spacing (e.g., the average radial spacing 322a) above a first perimeter region of a disc structure (e.g., the disc structure 316), where the rotational magnet system includes a second curved segment (e.g., the curved segment 318b) of vertically-arranged magnetic pillars (e.g., the magnetic components 320b1-320b3) having a second average radial spacing (e.g., the average radial spacing 322b) above a second, opposite perimeter region of the disc structure, and where the second average radial spacing is less than the first average radial spacing. The series of operations includes performing a deposition operation to deposit a material (e.g., the layer of material 410) onto the semiconductor substrate using the electromagnetic field.

Additionally, or alternatively, the series of operations includes receiving, onto a pedestal component (e.g., the pedestal component 204), a semiconductor substrate (e.g., the semiconductor substrate 206). The series of operations includes generating, over the semiconductor substrate, an electromagnetic field (e.g., the electromagnetic field 312) using a pattern of magnetic components (e.g., the magnetic components 320) located within an approximately planar and circular area above the semiconductor substrate, where the pattern includes a first, outermost curved segment (e.g., the curved segment 318a) of magnetic components (e.g., the magnetic components 320a1-320a3) having a first average curved spacing (e.g., the average radial spacing 322a) near a first perimeter region of the approximately planar and circular area, and where the pattern includes a second, outermost curved segment (e.g., the curved segment 318b) of magnetic components (e.g., the magnetic components 320b1-320b3) having a second average curved spacing near a second perimeter region of the approximately planar and circular area, where the second average curved spacing is different than the first average curved spacing. The series of operations includes performing a deposition operation to deposit a material (e.g., the layer of material 410) onto the semiconductor substrate using the electromagnetic field.

Figure 5:
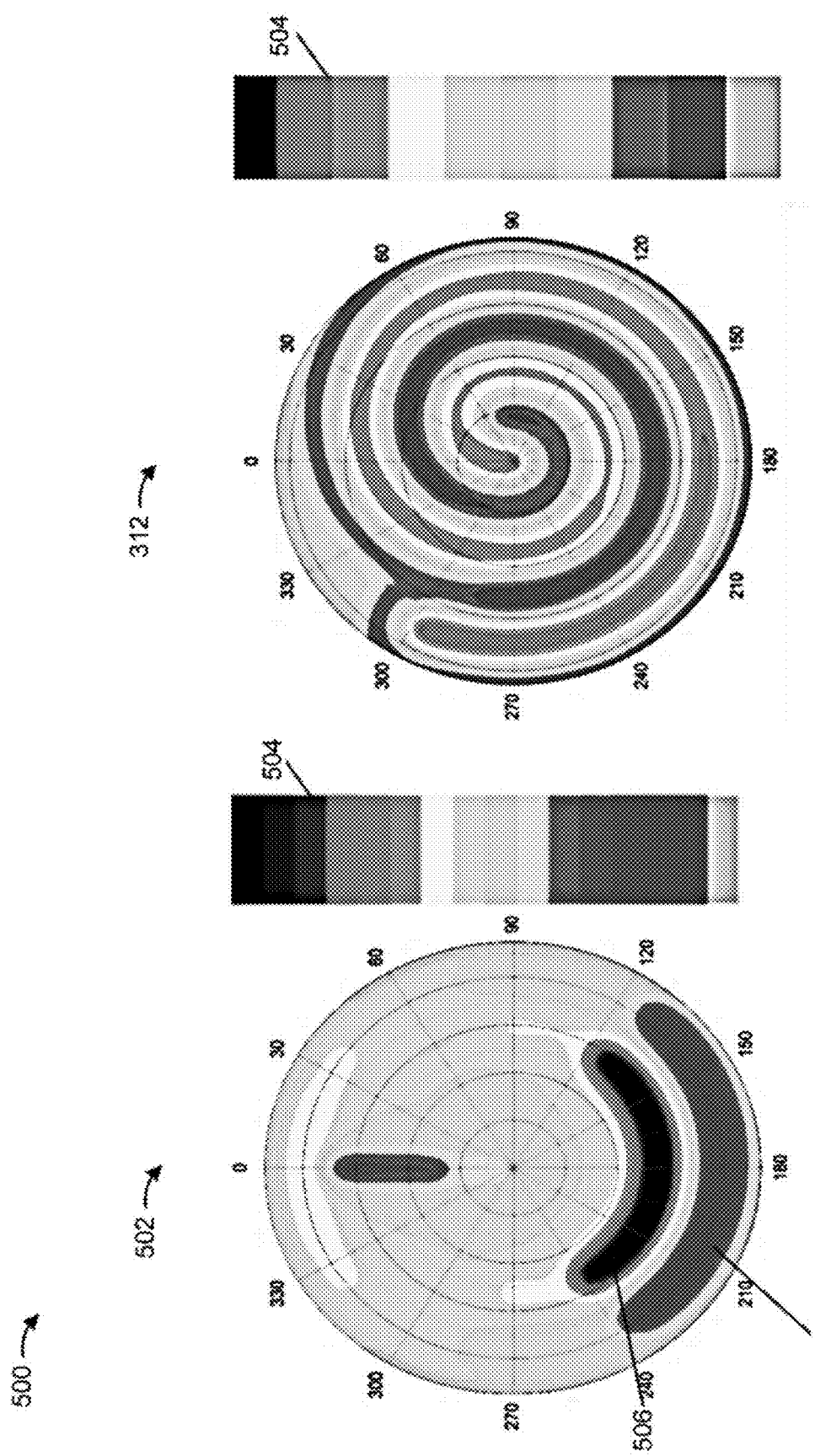
FIGS. 5 and 6 are diagrams of data related to example implementations described herein.

FIG. 5 is a diagram of data related to an example implementation 500 described herein. The data of FIG. 5 includes electromagnetic fields 502 and 312 and a graphical representation of a strength 504 (e.g., a strength in gauss) across the electromagnetic fields 502 and 312.

The electromagnetic field 502 may be an electromagnetic field generated by a rotational magnetic system other than the rotational magnetic system described in connection with FIGS. 2-4C (e.g., the rotational magnetic system that generates electromagnetic field 502 may exclude the magnet fixture 302). As shown in FIG. 5, the electromagnetic field 502 includes a distribution of electromagnetic strengths with "hot spots" 506 and 508. In particular, the strength 504 of the hot spot 506 may exceed approximately +700 gauss, and the strength of the hot spot 508 may exceed −600 gauss.

In contrast, the electromagnetic field 312 may be an electromagnetic field generated by a rotational magnetic system described in connection with FIGS. 2-4C (e.g., the rotational magnetic system that generates electromagnetic field 312 may include the magnet fixture 302). As shown in FIG. 5, the electromagnetic field 312 includes a spiral-shaped distribution having a more uniform distribution of strength relative to the electromagnetic field 502. Further, the distribution of strengths of the electromagnetic field 312 may be included in a range of approximately −600 gauss to approximately +600 gauss.

For the electromagnetic field 312, a distribution having strengths 504 that exceed approximately −600 gauss (e.g., more negative than approximately −600 gauss) may result in a uniformity of a material (e.g., the layer of material 410 of FIG. 4C) being deposited using the rotational magnetic system to not satisfy a threshold. A distribution having strengths 504 that are between approximately −600 gauss and approximately +600 gauss may result in the uniformity of the material being deposited satisfying the threshold. A distribution having strengths that are greater than approximately +600 Gauss may in a uniformity of the material being deposited using the electromagnetic field to not satisfy a threshold. However, other values and ranges for the strengths of the electromagnetic field 312 are within the scope of the present disclosure.

As indicated above, FIG. 5 is provided as an example. Other examples may differ from what is described with regard to FIG. 5.

Figure 6:
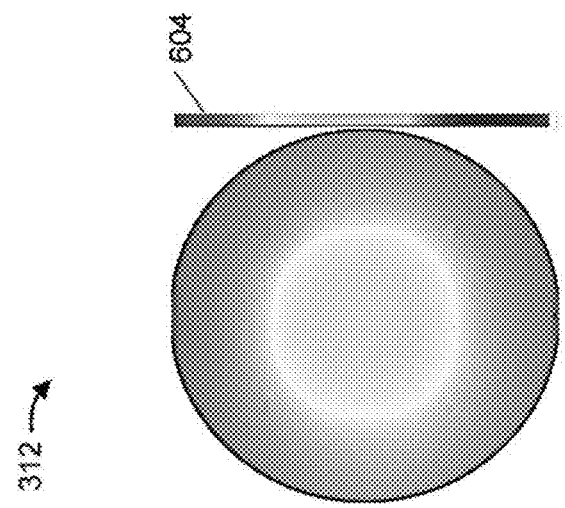
Figure 6:
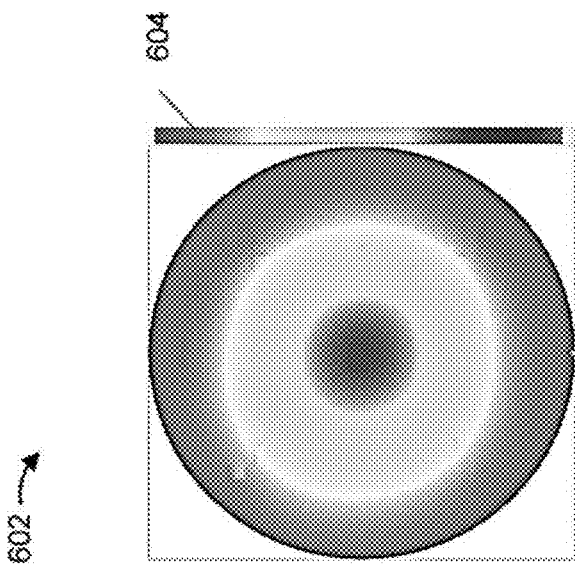

FIG. 6 is a diagram of data related to an example implementation 600 described herein. The data of FIG. 6 includes electromagnetic fields 602 and 312 in relation to a thickness 604 of a material (e.g., tungsten) deposited using the electromagnetic fields 602 and 312.

The electromagnetic field 602 may be an electromagnetic field generated by a rotational magnetic system other than the rotational magnetic system described in connection with FIGS. 2-4C (e.g., the rotational magnetic system that generates electromagnetic field 602 may exclude the magnet fixture 302). As shown in FIG. 6, a variation (e.g., a uniformity) in the thickness 604 of the material deposited using the electromagnetic field 502 is greater than a variation in the thickness of the material deposited using the electromagnetic field 312. For example, the variation in the thickness 604 of the material deposited using the electromagnetic field 502 may be in a range from approximately 0 angstroms up to approximately 100 angstroms, and the variation in the thickness 604 of the material deposited using the electromagnetic field 312 may be in a range from approximately 0 angstroms up to approximately 20 angstroms.

A variation in the thickness 604 thickness that is less than or equal to approximately 20 angstroms may be sufficient for a resistivity of a top electrode structure of a memory device formed using an electromagnetic field to satisfy a threshold needed for functionality. A variation in the thickness 604 that is greater than approximately 20 angstroms may cause the resistivity to not satisfy the threshold and cause the memory cell device to malfunction. However, other values and ranges for the variation in the thickness 604 (e.g., the variation of the thickness 604 in angstroms) are within the scope of the present disclosure.

Additionally, or alternatively, the variation in the thickness 604 of the material deposited using the electromagnetic field 312 may be included in a range from approximately 0% to approximately 1%. A variation in the thickness 604 that is less than or equal to approximately 1% may be sufficient for a resistivity of a top electrode structure of a memory device formed using an electromagnetic to satisfy a threshold needed for functionality. A variation in the thickness 604 that is greater than approximately 1% may cause the resistivity to not satisfy the threshold and cause the memory cell device to malfunction. However, other values and ranges for the variation in the thickness 604 (e.g., a % variation of the thickness 604) are within the scope of the present disclosure.

Additionally, or alternatively and based on the thickness 604 of the material deposited using the electromagnetic field 312, a resistivity of the material may be included in a range of approximately 19 micro-ohms per centimeter (µΩ/cm) to approximately 24 µΩ/cm. A resistivity that is less than or equal to approximately 19 µΩ/cm may fail to satisfy one or more first thresholds associated with a memory cell design to prevent deficiencies in the memory cell (e.g., increased leakage and/or increased power consumption). A resistivity that is greater than approximately 19 µΩ/cm may satisfy the one or more first thresholds. A resistivity of up approximately 24 µΩ/cm may satisfy one or more second thresholds associated with the memory cell design to prevent other deficiencies in the memory cell (e.g., increased voltage currents, reduced signal-to-noise ratios). A resistivity that is greater than or equal to approximately 24 µΩ/cm may fail to satisfy the one or more second thresholds. However, other values and ranges for the resistivity of the material are within the scope of the present disclosure.

As indicated above, FIG. 6 is provided as an example. Other examples may differ from what is described with regard to FIG. 6.

Figure 7:
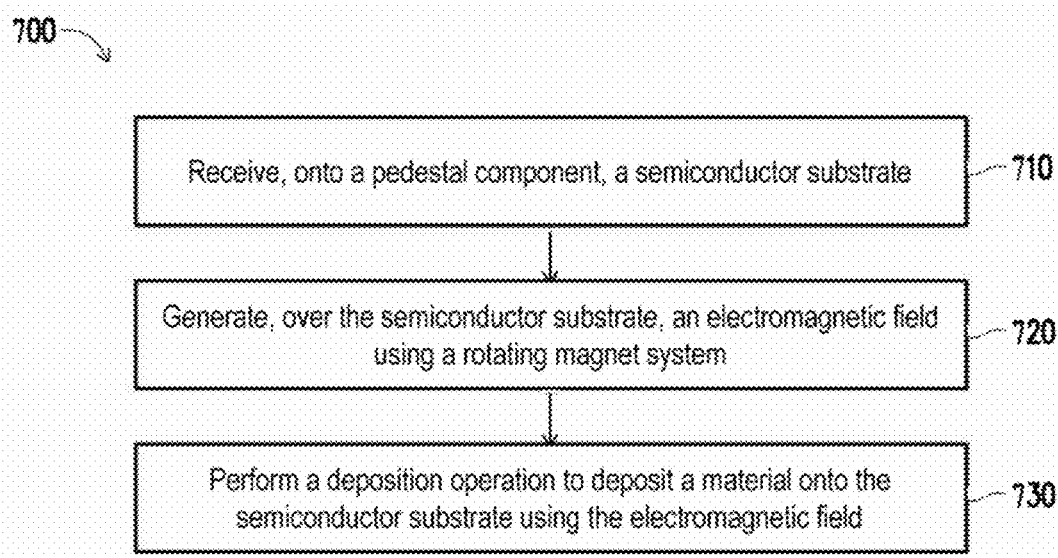
FIGS. 7 and 8 are flowcharts of example processes associated with performing a deposition operation using a deposition tool described herein.

FIG. 7 is a flowchart of an example process 700 associated with performing a deposition operation using a deposition tool described herein. In some implementations, one or more process blocks of FIG. 7 are performed by a semiconductor processing tool (e.g., the semiconductor processing system 100). In some implementations, one or more process blocks of FIG. 7 are performed by another device or a group of devices separate from or including the semiconductor processing system 100, such as the deposition tool 200 including the controller 230 and the rotational magnet system 226.

As shown in FIG. 7, process 700 may include receiving, onto a pedestal component, a semiconductor substrate (block 710). For example, a deposition tool (e.g., the deposition tool 200) may be used to receive, onto a pedestal component (e.g., the pedestal component 204), a semiconductor substrate (e.g., the semiconductor substrate 206) as described herein.

As further shown in FIG. 7, process 700 may include generating, over the semiconductor substrate, an electromagnetic field using a rotational magnet system (block 720). For example, the deposition tool may generate, over the semiconductor substrate, an electromagnetic field (e.g., the electromagnetic field 312) using a rotational magnet system (e.g., the rotational magnet system 226), as described herein. In some implementations, the rotational magnet system includes a first curved segment (e.g., the curved segment 318a) of vertically-arranged magnetic pillars (e.g., the magnetic components 320a1-320a3) having a first average radial spacing (e.g., the average radial spacing 322a) above a first perimeter region of a disc structure (e.g., the disc structure 316). In some implementations, the rotational magnet system includes a second curved segment (e.g., the curved segment 318b) of vertically-arranged magnetic pillars (e.g., the magnetic components 320b1-320b3) having a second average radial spacing (e.g., the average radial spacing 322b) above a second, opposite perimeter region of the disc structure. In some implementations, the second average radial spacing is less than the first average radial spacing.

As further shown in FIG. 7, process 700 may include performing a deposition operation to deposit a material onto the semiconductor substrate using the electromagnetic field (block 730). For example, the deposition tool may be used to perform a deposition operation to deposit a material (e.g., the layer of material 410) onto the semiconductor substrate using the electromagnetic field, as described herein.

Process 700 may include additional implementations, such as any single implementation or any combination of implementations described below and/or in connection with one or more other processes described elsewhere herein.

In a first implementation, generating the electromagnetic field using the rotational magnet system includes using a machine learning model to determine a rotational profile based on a pattern of vertically-arranged magnetic pillars that includes the first curved segment of vertically-arranged magnetic pillars and the second curved segment of vertically-arranged magnetic pillars.

In a second implementation, alone or in combination with the first implementation, determining the rotational profile based on the pattern of vertically-arranged magnetic pillars that includes the first curved segment of vertically-arranged magnetic pillars and the second curved segment of vertically-arranged magnetic pillars includes determining a rotational profile that includes varying a rate of rotation of the rotational magnet system.

In a third implementation, alone or in combination with one or more of the first and second implementations, determining the rotational profile based on the pattern of vertically-arranged magnetic pillars that includes the first curved segment of vertically-arranged magnetic pillars and the second curved segment of vertically-arranged magnetic pillars includes determining a rotational profile that includes pausing or changing a direction of a rotation of the rotational magnet system.

In a fourth implementation, alone or in combination with one or more of the first through third implementations, generating the electromagnetic field using the rotational magnet system includes generating an unbiased electromagnetic field.

In a fifth implementation, alone or in combination with one or more of the first through fourth implementations, performing the deposition operation to deposit the material onto the semiconductor substrate using the electromagnetic field includes performing the deposition operation within a processing chamber that includes the pedestal component, wherein a temperature of an environment within the processing chamber is a same approximate temperature as a temperature of an ambient environment in which the processing chamber is located.

In a sixth implementation, alone or in combination with one or more of the first through fifth implementations, performing the deposition operation to deposit the material onto the semiconductor substrate using the electromagnetic field includes depositing a tungsten material onto the semiconductor substrate.

Although FIG. 7 shows example blocks of process 700, in some implementations, process 700 includes additional blocks, fewer blocks, different blocks, or differently arranged blocks than those depicted in FIG. 7. Additionally, or alternatively, two or more of the blocks of process 700 may be performed in parallel.

Figure 8:
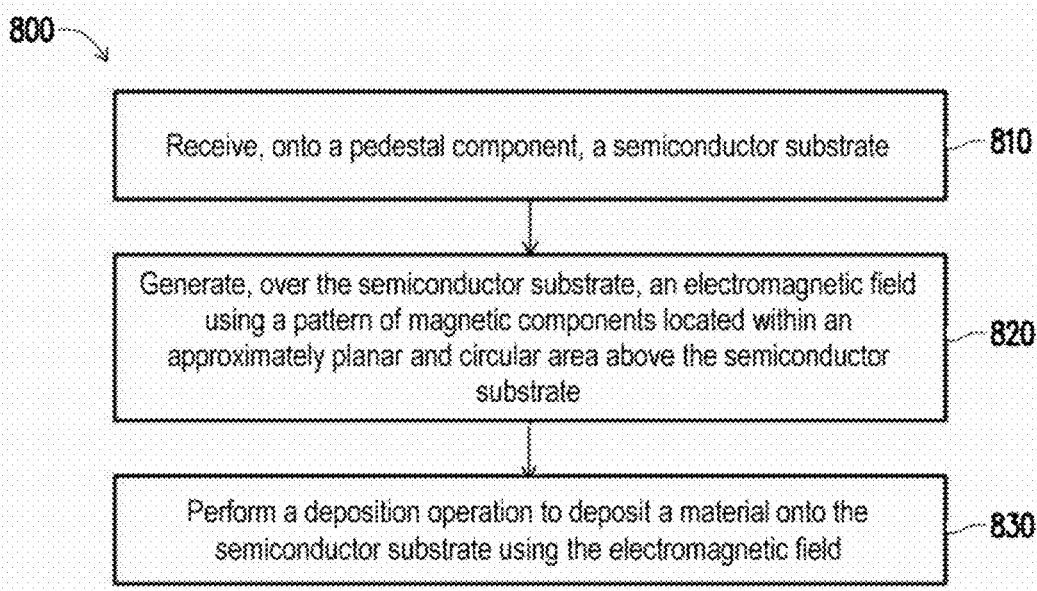

FIG. 8 is a flowchart of an example process 800 associated with performing a deposition operation using a deposition tool described herein. In some implementations, one or more process blocks of FIG. 8 are performed by a semiconductor processing tool (e.g., the semiconductor processing system 100). In some implementations, one or more process blocks of FIG. 8 are performed by another device or a group of devices separate from or including the semiconductor processing system 100, such as the deposition tool 200 including the rotational magnet system 226.

As shown in FIG. 8, process 800 may include receiving, onto a pedestal component, a semiconductor substrate (block 810). For example, a deposition tool (e.g., the deposition tool 200) may be used to receive, onto a pedestal component (e.g., the pedestal component 204), a semiconductor substrate (e.g., the semiconductor substrate 206), as described herein.

As further shown in FIG. 8, process 800 may include generating, over the semiconductor substrate, an electromagnetic field using a pattern of magnetic components located within an approximately planar and circular area above the semiconductor substrate (block 820). For example, a rotational magnet system (e.g., the rotational magnet system 226) may be used to generate, over the semiconductor substrate, an electromagnetic field (e.g., the electromagnetic field 312) using a pattern of magnetic components (e.g., the magnetic components 320) located within an approximately planar and circular area above the semiconductor substrate, as described herein. In some implementations, the pattern includes a first, outermost curved segment (e.g., the curved segment 318a) of magnetic components (e.g., the magnetic components 320a1-320a3) having a first average curved spacing (e.g., the average radial spacing 322a) near a perimeter region of the approximately planar and circular area. In some implementations, the pattern includes a second, outermost curved segment (e.g., the curved segment 318b) of magnetic components (e.g., the magnetic components 320b1-320b3) having a second average curved spacing (e.g., the average radial spacing 322b) near the perimeter region of the approximately planar and circular area. In some implementations, the second average curved spacing is different than the first average curved spacing.

As further shown in FIG. 8, process 800 may include performing a deposition operation to deposit a material onto the semiconductor substrate using the electromagnetic field (block 830). For example, the deposition tool may be used to perform a deposition operation to deposit a material (e.g., the layer of material 410) onto the semiconductor substrate using the electromagnetic field, as described herein.

Process 800 may include additional implementations, such as any single implementation or any combination of implementations described below and/or in connection with one or more other processes described elsewhere herein.

In a first implementation, process 800 includes the first, outermost curved segment of magnetic components and the second, outermost curved segment of magnetic components located near opposite sides of the perimeter region of the approximately planar and circular area.

In a second implementation, alone or in combination with the first implementation, generating the electromagnetic field includes rotating the pattern of magnetic components within the approximately planar and circular area.

In a third implementation, alone or in combination with one or more of the first and second implementations, generating the electromagnetic field includes generating an unbiased electromagnetic field.

In a fourth implementation, alone or in combination with one or more of the first through third implementations, performing the deposition operation to deposit the material onto the semiconductor substrate using the electromagnetic field includes depositing the material to have a thickness variation that is included in a range from greater than 0 angstroms and up to approximately 20 angstroms.

In a fifth implementation, alone or in combination with one or more of the first through fourth implementations, rotating the pattern of magnetic components within the approximately planar and circular area includes rotating a spiral-shaped distribution pattern of magnetic components (e.g., a spiral shaped distribution of the magnetic components 320) within the approximately planar and circular area.

In a sixth implementation, alone or in combination with one or more of the first through fifth implementations, rotating the spiral-shaped distribution of magnetic components within the approximately planar and circular area includes generating an electromagnetic field having a distribution that is included in a range of approximately −600 gauss to approximately +600 gauss.

Although FIG. 8 shows example blocks of process 800, in some implementations, process 800 includes additional blocks, fewer blocks, different blocks, or differently arranged blocks than those depicted in FIG. 8. Additionally, or alternatively, two or more of the blocks of process 800 may be performed in parallel.

Some implementations herein provide a PVD tool that includes a rotational magnet system configured to generate a magnetic field in a processing chamber of the PVD tool. The magnetic field may be used to control the distribution and/or flow of material from a target structure in the processing chamber to a semiconductor substrate in the processing chamber. The rotational magnet system includes a spiral pattern of magnetic pillars on a disc structure. The quantity, spacing, and/or arrangement of the magnetic pillars in the spiral pattern are configured to reduce the likelihood of formation of hot spots in the electromagnetic field in the processing chamber. The reduced likelihood of hot spots in the electromagnetic field enables the PVD tool to deposit layers with high thickness uniformity, particularly for thick layers (e.g., approximately 450 angstroms or greater, among other examples). This enables the PVD tool to satisfy a uniformity threshold of a material deposited onto a semiconductor device by the PVD tool, which may decrease electrical resistance for the semiconductor device and/or may increase the operating performance of the semiconductor device. Additionally and/or alternatively, the increased deposition uniformity of the PVD tool may enable a yield of integrated circuitry fabricated as part of a semiconductor device on a semiconductor substrate is increased. Increasing the yield of the integrated circuitry may reduce a quantity of resources (e.g., raw materials, labor, semiconductor processing tools, and/or computing resources) required to fabricate a volume of the semiconductor device.

As described in greater detail above, some implementations described herein provide a method. The method includes receiving, onto a pedestal component, a semiconductor substrate. The method includes generating, over the semiconductor substrate, an electromagnetic field using a rotational magnet system, where the rotational magnet system includes a first curved segment of vertically-arranged magnetic pillars having a first average radial spacing above a first perimeter region of a disc structure where the rotational magnet system includes a second curved segment of vertically-arranged magnetic pillars having a second average radial spacing above a second, opposite perimeter region of the disc structure, and where the second average radial spacing is less than the first average radial spacing. The method includes performing a deposition operation to deposit a material onto the semiconductor substrate using the electromagnetic field.

As described in greater detail above, some implementations described herein provide a method. The method includes receiving, onto a pedestal component, a semiconductor substrate. The method includes generating, over the semiconductor substrate, an electromagnetic field using a pattern of magnetic components located within an approximately planar and circular area above the semiconductor substrate, where the pattern includes a first, outermost curved segment of magnetic components having a first average curved spacing near a first perimeter region of the approximately planar and circular area, and where the pattern includes a second, outermost curved segment of magnetic components having a second average curved spacing near a second perimeter region of the approximately planar and circular area, where the second average curved spacing is different than the first average curved spacing. The method includes performing a deposition operation to deposit a material onto the semiconductor substrate using the electromagnetic field.

As described in greater detail above, some implementations described herein provide a deposition tool. The deposition tool includes a rotational magnet system that includes a distribution of magnetic components configured to generate an electromagnetic field. The distribution of magnetic components includes a first curved segment that is located on a first perimeter region of a disc structure having a first set of magnetic components with a first average radial spacing. The distribution of magnetic components includes a second curved segment that is located on a second perimeter region of the disc structure and having a second set of magnetic components with a second average radial spacing, where the second average radial spacing is less than the first average radial spacing. The deposition tool includes a processing chamber below the rotational magnet system. The deposition tool includes a controller configured to activate the rotational magnet system to rotate the distribution of magnetic components above the processing chamber during a sputtering operation.

As used herein, "satisfying a threshold" may, depending on the context, refer to a value being greater than the threshold, greater than or equal to the threshold, less than the threshold, less than or equal to the threshold, equal to the threshold, not equal to the threshold, or the like.

As used herein, the term "and/or," when used in connection with a plurality of items, is intended to cover each of the plurality of items alone and any and all combinations of the plurality of items. For example, "A and/or B" covers "A and B," "A and not B," and "B and not A."

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:
receiving, onto a pedestal component, a semiconductor substrate;
generating, over the semiconductor substrate, an electromagnetic field using a rotational magnet system,
wherein the rotational magnet system includes a first curved segment of vertically-arranged magnetic pillars having a first average radial spacing above a first perimeter region of a disc structure,
wherein the rotational magnet system includes a second curved segment of vertically-arranged magnetic pillars having a second average radial spacing, less than the first average radial spacing, above a second perimeter region of the disc structure, and
wherein the rotational magnet system includes a third curved segment of vertically-arranged magnetic pillars having a third average radial spacing, less than the first average radial spacing and the second average radial spacing, above a third perimeter region of the disc structure; and
performing a deposition operation to deposit a material onto the semiconductor substrate using the electromagnetic field.

2. The method of claim 1, wherein generating the electromagnetic field using the rotational magnet system includes:
using a machine learning model to determine a rotational profile based on a pattern of vertically-arranged magnetic pillars that includes the first curved segment of vertically-arranged magnetic pillars and the second curved segment of vertically-arranged magnetic pillars.

3. The method of claim 2, wherein determining the rotational profile based on the pattern of vertically-arranged magnetic pillars that includes the first curved segment of vertically-arranged magnetic pillars and the second curved segment of vertically-arranged magnetic pillars includes:
determining a rotational profile that includes varying a rate of rotation of the rotational magnet system.

4. The method of claim 2, wherein determining the rotational profile based on the pattern of vertically-arranged magnetic pillars that includes the first curved segment of vertically-arranged magnetic pillars and the second curved segment of vertically-arranged magnetic pillars includes:
determining a rotational profile that includes pausing or changing a direction of a rotation of the rotational magnet system.

5. The method of claim 1, wherein generating the electromagnetic field using the rotational magnet system includes:
generating an unbiased electromagnetic field.

6. The method of claim 1, wherein performing the deposition operation to deposit the material onto the semiconductor substrate using the electromagnetic field includes:
performing the deposition operation within a processing chamber that includes the pedestal component,
wherein a temperature of an environment within the processing chamber is a same approximate temperature as a temperature of an ambient environment in which the processing chamber is located.

7. The method of claim 1, wherein performing the deposition operation to deposit the material onto the semiconductor substrate using the electromagnetic field includes:
depositing a tungsten material onto the semiconductor substrate.

8. A method, comprising:
receiving, onto a pedestal component, a semiconductor substrate;
generating, over the semiconductor substrate, an electromagnetic field using a pattern of magnetic components located within an approximately planar and circular area above the semiconductor substrate,
wherein the pattern includes a first, curved segment of magnetic components having a first average curved spacing near a perimeter region of the approximately planar and circular area,
wherein the pattern includes a second, curved segment of magnetic components having a second average curved spacing, different than the first average curved spacing, near the perimeter region, and
wherein the pattern includes a third curved segment of magnetic components having a third average curved spacing, different than the first average curved spacing and the second average curved spacing, near the perimeter region; and
performing a deposition operation to deposit a material onto the semiconductor substrate using the electromagnetic field.

9. The method of claim 8, wherein:
the first curved segment of magnetic components and the second curved segment of magnetic components are located near opposite sides of the perimeter region of the approximately planar and circular area.

10. The method of claim 8, wherein generating the electromagnetic field includes:
rotating the pattern of magnetic components within the approximately planar and circular area.

11. The method of claim 8, wherein generating the electromagnetic field includes:
generating an unbiased electromagnetic field.

12. The method of claim 8, wherein performing the deposition operation to deposit the material onto the semiconductor substrate using the electromagnetic field includes:
depositing the material to have a thickness variation that is included in a range from greater than 0 angstroms and up to approximately 20 angstroms.

13. The method of claim 8, wherein rotating the pattern of magnetic components within the approximately planar and circular area includes:
rotating a spiral-shaped distribution pattern of magnetic components within the approximately planar and circular area.

14. The method of claim 13, wherein rotating the spiral-shaped distribution pattern of magnetic components within the approximately planar and circular area includes:
generating an electromagnetic field having a distribution that is included in a range of approximately −600 gauss to approximately +600 gauss.

15. A deposition tool, comprising:
a rotational magnet system, comprising:
a distribution of magnetic components configured to generate an electromagnetic field and comprising:
a first curved segment that is located on a first perimeter region of a disc structure having a first set of magnetic components with a first average radial spacing;
a second curved segment that is located on a second perimeter region of the disc structure and having a second set of magnetic components with a second average radial spacing that is less than the first average radial spacing; and a third curved segment that is located on a third perimeter region of the disc structure and having a third set of magnetic components with a third average radial spacing that is less than the first average radial spacing and the second average radial spacing;

a processing chamber below the rotational magnet system; and a controller configured to activate the rotational magnet system to rotate the distribution of magnetic components above the processing chamber during a sputtering operation.

16. The deposition tool of claim 15, wherein the rotational magnet system is an unbiased rotational magnet system.

17. The deposition tool of claim 15, wherein
the third perimeter region is adjacent to the second perimeter region.

18. The deposition tool of claim 15, wherein the distribution of magnetic components comprises:
vertically-arranged magnetic pillars.

19. The deposition tool of claim 18, wherein the distribution of vertically-arranged magnetic pillars is between a frame structure and a disc structure.

20. The deposition tool of claim 19, wherein the frame structure comprises a spiral pattern.

* * * * *